US007608538B2

(12) United States Patent
Deligianni et al.

(10) Patent No.: US 7,608,538 B2
(45) Date of Patent: Oct. 27, 2009

(54) FORMATION OF VERTICAL DEVICES BY ELECTROPLATING

(75) Inventors: Hariklia Deligianni, Tenafly, NJ (US); Qiang Huang, Ossining, NY (US); John P. Hummel, Millbrook, NY (US); Lubomyr T. Romankiw, Briarcliff Manor, NY (US); Mary B. Rothwell, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 183 days.

(21) Appl. No.: 11/620,497

(22) Filed: Jan. 5, 2007

(65) Prior Publication Data

US 2008/0166874 A1 Jul. 10, 2008

(51) Int. Cl.
*H01L 21/44* (2006.01)

(52) U.S. Cl. .............. 438/675; 257/625; 257/E21.175; 205/67; 205/87; 205/93; 205/925; 205/74; 205/69; 205/127; 427/162; 204/194

(58) Field of Classification Search ............ 438/469, 438/927, 675, 622; 257/767, 625
See application file for complete search history.

(56) References Cited

U.S. PATENT DOCUMENTS

| | | | | |
|---|---|---|---|---|
| 3,791,858 A | * | 2/1974 | McPherson et al. | 430/314 |
| 4,933,743 A | * | 6/1990 | Thomas et al. | 257/742 |
| 4,962,058 A | * | 10/1990 | Cronin et al. | 438/622 |
| 5,034,799 A | * | 7/1991 | Tomita et al. | 257/758 |
| 5,149,615 A | * | 9/1992 | Chakravorty et al. | 430/313 |
| 5,173,442 A | * | 12/1992 | Carey | 216/18 |
| 5,191,174 A | * | 3/1993 | Chang et al. | 174/266 |
| 5,329,695 A | * | 7/1994 | Traskos et al. | 29/830 |
| 5,386,627 A | * | 2/1995 | Booth et al. | 29/852 |
| 5,413,962 A | * | 5/1995 | Lur et al. | 438/619 |
| 5,426,849 A | * | 6/1995 | Kimbara et al. | 29/830 |
| 5,440,805 A | * | 8/1995 | Daigle et al. | 29/830 |
| 5,508,938 A | * | 4/1996 | Wheeler | 716/19 |

(Continued)

OTHER PUBLICATIONS

Parkin, S. S. P. et al., Oscillations in Exchange Coupling and Magnetoresistance in Metallic Superlattice Structures: Co/Ru, Co/Cr, and Fe/Cr, The American Physical Society, 1990, pp. 2304-2308, Vol. 64, No. 19.

(Continued)

*Primary Examiner*—N Drew Richards
*Assistant Examiner*—Ankush K Singal
(74) *Attorney, Agent, or Firm*—Scully, Scott, Murphy & Presser, P.C.

(57) ABSTRACT

The present invention is related to a method for forming vertical conductive structures by electroplating. Specifically, a template structure is first formed, which includes a substrate, a discrete metal contact pad located on the substrate surface, an inter-level dielectric (ILD) layer over both the discrete metal contact pad and the substrate, and a metal via structure extending through the ILD layer onto the discrete metal contact pad. Next, a vertical via is formed in the template structure, which extends through the ILD layer onto the discrete metal contact pad. A vertical conductive structure is then formed in the vertical via by electroplating, which is conducted by applying an electroplating current to the discrete metal contact pad through the metal via structure. Preferably, the template structure comprises multiple discrete metal contact pads, multiple metal via structures, and multiple vertical vias for formation of multiple vertical conductive structures.

16 Claims, 6 Drawing Sheets

U.S. PATENT DOCUMENTS

| | | | | |
|---|---|---|---|---|
| 5,539,247 | A * | 7/1996 | Cheung et al. | 257/758 |
| 5,675,187 | A * | 10/1997 | Numata et al. | 257/758 |
| 5,753,539 | A * | 5/1998 | Okazaki | 438/132 |
| 5,792,706 | A * | 8/1998 | Michael et al. | 438/626 |
| 5,798,559 | A * | 8/1998 | Bothra et al. | 257/522 |
| 5,882,963 | A * | 3/1999 | Kerber et al. | 438/195 |
| 5,900,668 | A * | 5/1999 | Wollesen | 257/522 |
| 6,037,248 | A * | 3/2000 | Ahn | 438/619 |
| 6,081,021 | A * | 6/2000 | Gambino et al. | 257/530 |
| 6,081,032 | A * | 6/2000 | Wu | 257/752 |
| 6,124,198 | A * | 9/2000 | Moslehi | 438/622 |
| 6,194,233 | B1 * | 2/2001 | Bedner et al. | 438/14 |
| 6,207,553 | B1 * | 3/2001 | Buynoski et al. | 438/622 |
| 6,239,491 | B1 * | 5/2001 | Pasch et al. | 257/750 |
| 6,242,286 | B1 * | 6/2001 | Cellarosi | 438/109 |
| 6,245,658 | B1 * | 6/2001 | Buynoski | 438/619 |
| 6,268,276 | B1 * | 7/2001 | Chan et al. | 438/619 |
| 6,277,728 | B1 * | 8/2001 | Ahn et al. | 438/619 |
| 6,307,213 | B1 * | 10/2001 | Huang et al. | 257/50 |
| 6,333,255 | B1 * | 12/2001 | Sekiguchi | 438/622 |
| 6,344,125 | B1 * | 2/2002 | Locke et al. | 205/118 |
| 6,413,854 | B1 * | 7/2002 | Uzoh et al. | 438/637 |
| 6,501,180 | B1 * | 12/2002 | Kitch | 257/762 |
| 6,525,921 | B1 * | 2/2003 | Nakatani et al. | 361/306.3 |
| 6,534,723 | B1 * | 3/2003 | Asai et al. | 174/255 |
| 6,667,552 | B1 * | 12/2003 | Buynoski | 257/758 |
| 6,709,562 | B1 | 3/2004 | Andricacos et al. | |
| 6,710,443 | B1 * | 3/2004 | Rost et al. | 257/712 |
| 6,713,835 | B1 * | 3/2004 | Horak et al. | 257/522 |
| 6,784,478 | B2 * | 8/2004 | Merchant et al. | 257/303 |
| 6,806,096 | B1 | 10/2004 | Kim et al. | |
| 6,806,551 | B2 * | 10/2004 | Liu et al. | 257/529 |
| 6,881,999 | B2 * | 4/2005 | Lee et al. | 257/306 |
| 6,897,148 | B2 * | 5/2005 | Halahan et al. | 438/678 |
| 6,930,256 | B1 * | 8/2005 | Huemoeller et al. | 174/260 |
| 6,940,170 | B2 * | 9/2005 | Parikh | 257/750 |
| 6,984,892 | B2 * | 1/2006 | Gotkis et al. | 257/758 |
| 6,998,327 | B2 * | 2/2006 | Danielson et al. | 438/455 |
| 7,060,604 | B2 * | 6/2006 | Kata et al. | 438/622 |
| 7,064,439 | B1 * | 6/2006 | Berthold et al. | 257/758 |
| 7,091,611 | B2 * | 8/2006 | Ahn et al. | 257/758 |
| 7,108,797 | B2 | 9/2006 | Chen et al. | |
| 7,151,051 | B2 * | 12/2006 | He et al. | 438/622 |
| 7,172,980 | B2 * | 2/2007 | Torres et al. | 438/783 |
| 7,185,426 | B1 * | 3/2007 | Hiner et al. | 29/841 |
| 7,233,066 | B2 * | 6/2007 | Kata et al. | 257/734 |
| 7,247,524 | B2 * | 7/2007 | Nakagawa | 438/118 |
| 7,260,890 | B2 * | 8/2007 | White et al. | 29/830 |
| 7,262,505 | B2 * | 8/2007 | Ahn et al. | 257/758 |
| 7,329,953 | B2 * | 2/2008 | Tu | 257/758 |
| 7,411,306 | B2 * | 8/2008 | Leu et al. | 257/778 |
| 2001/0014526 | A1 * | 8/2001 | Clevenger et al. | 438/619 |
| 2001/0023986 | A1 * | 9/2001 | Mancevski | 257/741 |
| 2002/0158337 | A1 * | 10/2002 | Babich et al. | 257/758 |
| 2002/0164840 | A1 * | 11/2002 | Lu et al. | 438/129 |
| 2003/0073302 | A1 * | 4/2003 | Huibers | 438/622 |
| 2003/0154583 | A1 * | 8/2003 | Fujii et al. | 29/25.03 |
| 2004/0101663 | A1 * | 5/2004 | Agarwala et al. | 428/209 |
| 2006/0012052 | A1 * | 1/2006 | McDevitt et al. | 257/778 |
| 2006/0022286 | A1 | 2/2006 | Leuschner et al. | |
| 2007/0128868 | A1 * | 6/2007 | Halahan et al. | 438/687 |
| 2007/0228559 | A1 * | 10/2007 | Tsuruko | 257/734 |
| 2008/0142253 | A1 * | 6/2008 | Salama et al. | 174/258 |

OTHER PUBLICATIONS

Parkin S. S. P., Oscillations in Giant Magnetoresistance and Antiferromagnetic Coupling in [Ni81Fe19/Cu]N Multilaters, Appl. Phys. Lett., Jan. 27, 1992, pp. 512-514, vol. 60, No. 4.

Jimbo, Mutsuko, Giant Magnetoresistance in FeNiCO / Cu Multilayers, Jpn. J. Appl. Phys., Sep. 15, 1992, pp. L 1348-L 1350, vol. 31, Part 2, No. 9B.

Alper, M. et al., Giant Magnetoresistance in Electrodeposited Superlattices, Appl. Phys. Lett, Oct. 11, 1993, pp. 2144-2146, vol. 63, No. 15.

Ross, C. A., Electrodeposited Multilayer Thin Films, Annu. Rev. Mater. Sci., 1994, pp. 159-188, Vol. 24, downloaded from arjournals.annualreviews.org.

Martin, Charles R., Nanomaterials: A Membrane-Based Synthetic Approach, Science, New Series, Dec. 23, 1994, pp. 1961-1966, vol. 266, No. 5193, downloaded from www.jstor.org.

* cited by examiner

FORMATION OF VERTICAL DEVICES BY ELECTROPLATING

CROSS-REFERENCE TO RELATED APPLICATION

The present application is related to co-pending U.S. patent applications entitled "MEMORY STORAGE DEVICES COMPRISING DIFFERENT FERROMAGNETIC MATERIAL LAYERS, AND METHODS OF MAKING AND USING THE SAME" Ser. No. 11/620,445 and "FORMATION OF NANOSTRUCTURES COMPRISING COMPOSITIONALLY MODULATED FERROMAGNETIC LAYERS BY PULSED ECD" Ser. No. 11/620,480 which were filed on even date herewith and are assigned to the same assignee as the present application. The entire contents of such co-pending U.S. patent applications are incorporated herewith by reference for all purposes.

FIELD OF THE INVENTION

The present invention relates to formation of vertical devices by electroplating, and more specifically, to formation of vertical structures using electroplating techniques.

BACKGROUND OF THE INVENTION

Electroplating, which is also referred to as electrodeposition, has been widely used for metallization in semiconductor manufacturing. Electroplating is particularly useful for forming deep metal vias that extend through the inter-level dielectric (ILD) layers to connect the metal contacts in different metal levels.

Figure 1A:
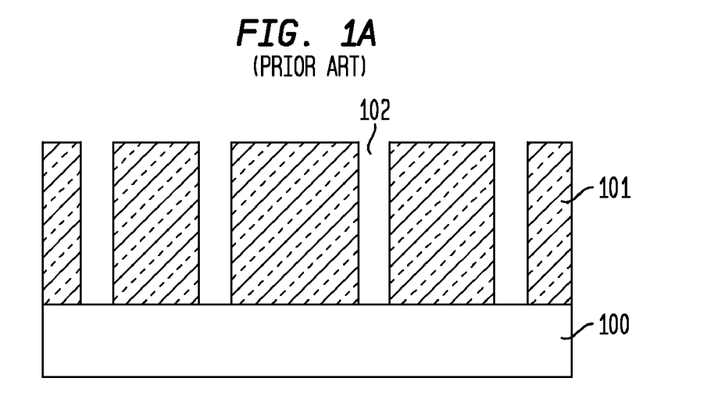
FIGS. 1A-1C are cross-sectional views that illustrate the processing steps of a conventional superfilling process for forming deep metal vias.
Figure 1B:
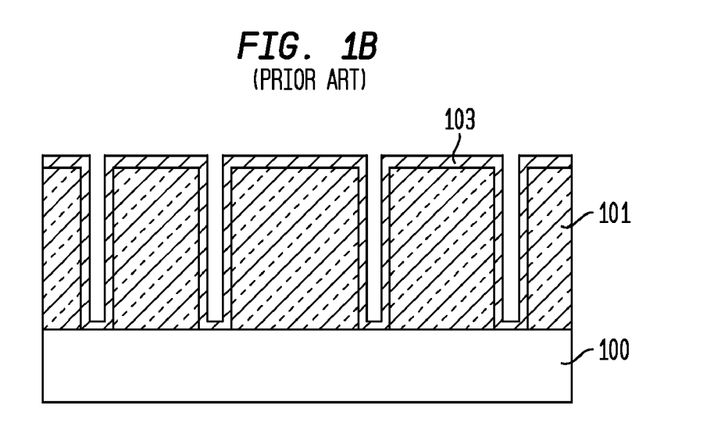
Figure 1C:
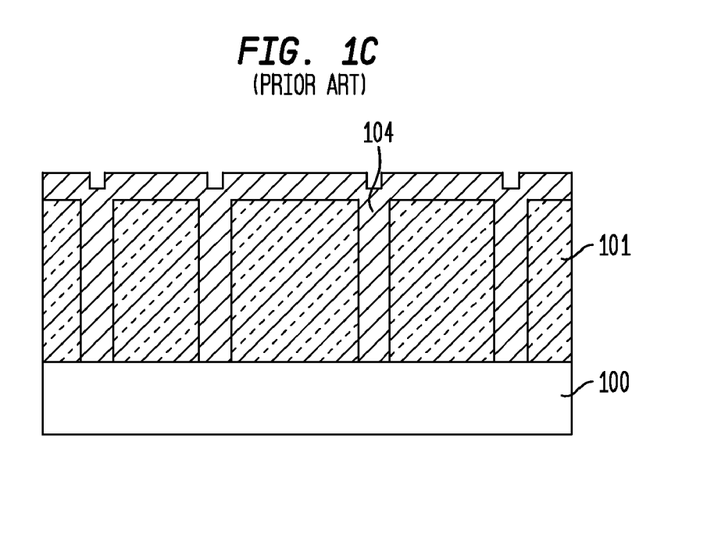

One of the conventional electroplating methods commonly used for copper metallization in semiconductor manufacturing processes is referred to as the damascene or superfilling method, as disclosed in U.S. Pat. No. 6,709,562 entitled "METHOD OF MAKING ELECTROPLATED INTERCONNECTION STRUCTURES ON INTEGRATED CIRCUIT CHIPS" and illustrated herein by FIGS. 1A-1C. First, a template structure is formed, which comprises a substrate 100 and an inter-level dielectric (ILD) layer 101, as shown in FIG. 1A. The substrate 100 may be formed of either an insulator or a semiconductor with little or practically no conductivity. The ILD layer 101 contains deep vias 102 therein, which can be readily formed by well-known photolithography and etching techniques. Next, a continuous metal seed layer 103 is deposited over the entire template structure, as shown in FIG. 1B. The metal seed layer 103 covers both the top surface of the ILD layer 101 and the sidewalls and bottom surfaces of the deep vias 102. The metal seed layer 103 comprises one or more contacts (not shown), through which an electroplating current can be applied to the metal seed layer 103. Electroplating of the template structure is then carried out by using a special electroplating chemistry, which preferentially deposits metal 104 into the deep vias 102 of the ILD layer 101 (i.e., the metal 104 is deposited into the deep vias 102 at a rate that is significantly faster than on the top surface of the ILD layer 101) to form metal wire structures free of voids, as shown in FIG. 1C.

The above-described superfilling method has advantages in filling vias with a single element or a homogeneous alloy of two or more different element. However, the superfilling method cannot be used to form a column with modulated compositions along a longitudinal axis thereof due to several reasons. First, the electroplating step in this method proceeds simultaneously on the bottom surface and over the sidewalls of the deep vias 102. Therefore, the superfilling method can only be used to form compositionally homogeneous structures (i.e., structures comprising the same metal or metal alloy throughout the entire structures), but not compositionally modulated structures (i.e., structures comprising alternating layers of different material compositions along the longitudinal direction). Further, the superfilling method requires a special electroplating chemistry, which contains numerous different additives, each of which exerts a different effect on the metal plating rate to jointly achieve the preferential metal deposition. Therefore, the superfilling method has so far only been used for plating of a single metal, such as copper, but not for plating of metal alloys or alternating layers of different metals, due to uncertainties related to how the different additives in the special electroplating chemistry will affect the plating rates of different metals.

Figure 2A:
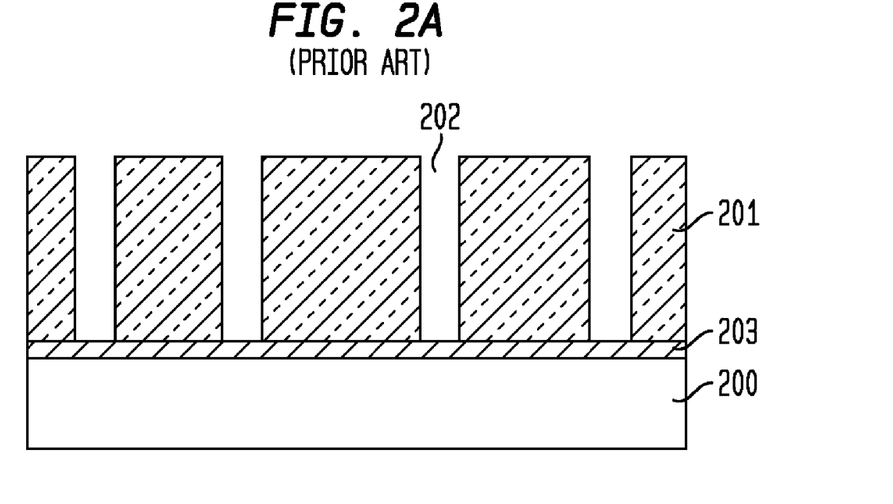
FIGS. 2A-2B are cross-sectional views that illustrate the processing steps of a conventional plating through mask process for forming deep metal vias.
Figure 2B:
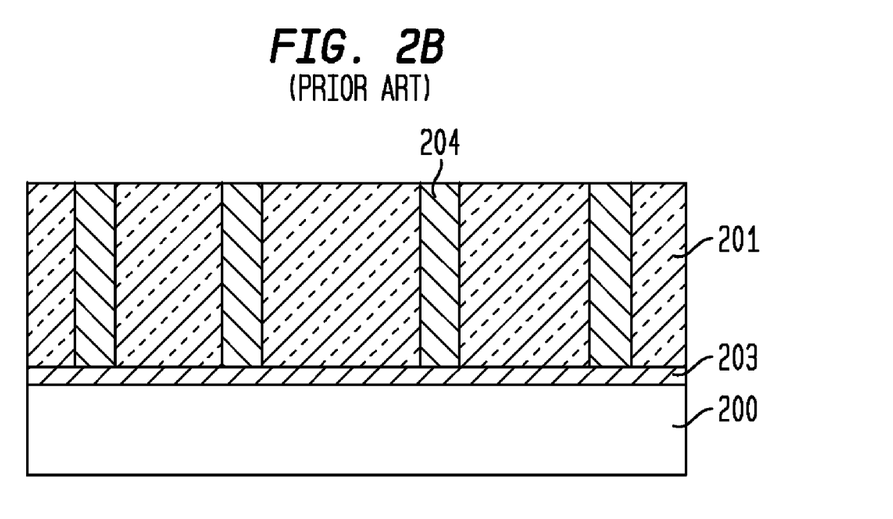

Another conventional electroplating method, which is commonly used for forming metal wire structures, is referred to as the plating through mask method and is illustrated by FIGS. 2A-2B. In this method, a continuous metal seed layer 203 is firstly deposited over a surface of the substrate 200, followed by the deposition of an inter-level layer 201 of photo-resist, dielectrics, or doped semiconductors with relatively low conductivity over the metal seed layer 203. Next, deep vias 202 are formed in the inter-level layer 201 by photolithography and etching, as shown in FIG. 2A. During subsequent electroplating, an electroplating current is applied to the metal seed layer 203 to deposit a metal 204 over the bottom surfaces of the deep vias 202 and gradually fill up the deep vias 202 to form vertical metal wire structures, as shown in FIG. 2B.

The plating through mask method is a bottom-up filling process, which can be used for forming not only metal wire structures that comprise a single metal, but also those comprising metal alloys. Further, it can be used to form compositionally modulated structures comprising alternating layers of different material compositions along longitudinal axes of the structures.

However, a major disadvantage of the traditional plating through mask or bottom-up plating process is the requirement for the continuous metal seed layer 203. Because the metal seed layer 203 is continuous over the entire surface of the substrate 200 and connects all the metal wire structures, such metal wires cannot function independently of one another and therefore cannot be used to form separate electronic devices, unless the metal seed layer 203 is selectively removed. However, because the metal seed layer 203 is sandwiched between the inter-level layer 201 and the substrate 200, it is almost impossible to remove it without disrupting or damaging the inter-level layer 201 and the substrate 200.

There is a continuing need for an improved method for forming vertical device structures. More importantly, there is a need for an improved method for forming separate vertical device structures that comprise alloys or alternating layers of different conductive materials.

SUMMARY OF THE INVENTION

The present invention employs discrete metal contact pads and metal vias for applying the electroplating current during the electroplating step. Such discrete metal contact pads and metal vias remain parts of the final devices and therefore allow the formation of vertical conductive structures that contain alloys of different conductive materials or alternating layers of different conductive materials, but without connecting all the vertical conductive structures together or otherwise affecting the independent functionality of each vertical conductive structures. In this manner, the resulting vertical conductive structures can be readily used to form separate electronic devices.

In one aspect, the present invention relates to a method comprising:

forming a template structure comprising a substrate, a discrete metal contact pad located over a top surface of the substrate, an inter-level dielectric (ILD) layer covering both the substrate and the metal contact pad, and a metal via structure extending through the ILD layer(s) to the discrete metal contact pad;

forming a vertical via in the template structure, wherein the vertical via extends through the ILD layer onto the discrete metal contact pad; and forming a vertical conductive structure in the vertical via by electroplating, wherein the electroplating is conducted by applying an electroplating current to the discrete metal contact pad under the ILD layer through the metallic via structure.

Preferably, but not necessarily, the vertical conductive structure comprises one or more ferromagnetic metals. More preferably, the vertical conductive structure comprises alternating layers of different ferromagnetic metals. Alternatively, the vertical conductive structure may comprise conductive polymers or doped semiconductor materials.

The template structure as described hereinabove may comprise a single metal contact pad on the upper surface of the substrate, with a single metal via structure and a single vertical via extending thereto for formation of a single vertical conductive structure. More preferably, the template structure of the present invention comprises multiple discrete metal contact pads located on the upper surface of the substrate and having multiple metal via structures and multiple vertical vias extending thereto. In this manner, multiple vertical conductive structures can be subsequently formed by electroplating in a single wafer or chip, while the resulted vertical conductive structures are not interconnected with one another.

In a specific embodiment of the present invention, the template structure further comprises a patterned metal layer that is located on an upper surface of the ILD layer and is electrically connected to all of the metal via structures, so that the electroplating can be carried out by applying an electroplating current to the multiple discrete metal contact pads through the patterned metal layer and the multiple metal via structures.

The patterned metal layer is preferably formed before the vertical vias. More preferably, it is formed by first depositing a blanket metal layer over the ILD layer and then patterning the blanket metal layer to form multiple openings that each is vertically aligned with one of the multiple discrete metal contact pads.

Further, an insulating layer can be formed over the patterned metal layer before formation of the multiple vertical vias, so that the subsequently formed vertical vias extend through both the insulating layer and the ILD layer. More preferably, the patterned metal layer is completely covered by the insulating layer, except in the edge region of the processing unit, i.e., wafer or substrate, so that the electroplating current can be carried through the edge region to the patterned metal layer during subsequent electroplating. After electroplating, both the patterned metal layer and the insulating layer are removed from the upper surface of the ILD layer, and multiple surface metal contacts can be formed thereover to provide access to the multiple vertical conductive structures.

In another aspect, the present invention relates to a device structure that comprises a substrate, a metal contact pad located over a top surface of the substrate, an inter-level dielectric (ILD) layer covering both the substrate and the metal contact pad, a metal via structure extending through the ILD layer to the discrete metal contact pad, and a vertical conductive structure extends through the ILD layer onto the discrete metal contact pad.

Other aspects, features and advantages of the invention will be more fully apparent from the ensuing disclosure and appended claims.

DETAILED DESCRIPTION OF THE INVENTION, AND PREFERRED EMBODIMENTS THEREOF

In the following description, numerous specific details are set forth, such as particular structures, components, materials, dimensions, processing steps and techniques, in order to provide a thorough understanding of the present invention. However, it will be appreciated by one skilled in the art that the invention may be practiced without these specific details or by substituting certain details with known equivalents thereof, without departing from the spirit of the invention. Further, standard structures or processing steps well known to those ordinarily skilled in the art have not been described in detail in order to avoid obscuring the invention.

It will be understood that when an element as a layer, region or substrate is referred to as being "on" another element, it can be directly on the other element or intervening elements may also be present. In contrast, when an element is referred to as being "directly on" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The term "vertical" as used herein refers to a structure or device that is located over a substrate surface, and the longitudinal axis of such a structure or device is perpendicular to the substrate surface.

The term "metal contact" or "metal contacts" as used herein refers to metal structures of limited lateral extension. Unlike a continuous metal layer that covers the entire substrate surface or a majority portion thereof, the metal contact or metal contacts only extend(s) over a selected region or selected regions of the substrate surface upon which subsequent device structures are to be built. The metal contact or metal contacts can be formed by patterning a continuous metal layer.

The term "discrete" as used herein refers to structures that are isolated from each other with no overlap therebetween.

The term "ferromagnetic material" as used herein refers to any material that can be magnetized by applying an external magnetic field and exhibits remnant magnetization after the external magnetic field is removed.

As mentioned hereinabove, the present invention uses discrete metal contact pads and metal via structures, which are the existing elements of an integrated circuit, to apply electroplating current during electroplating for forming vertical conductive structures. The resulting vertical conductive structures preferably, but not necessarily, contain alloys of different conductive materials (i.e., metals, conductive polymers, or doped semiconductors) or alternating layers of different conductive materials. The present invention is particularly useful for forming ferromagnetic structures that comprise alternating ferromagnetic layers of different material compositions, as described by the co-pending U.S. patent applications entitled "MEMORY STORAGE DEVICES COMPRISING DIFFERENT FERROMAGNETIC MATERIAL LAYERS, AND METHODS OF MAKING AND USING THE SAME" Ser. No. 11/620,445 and "FORMATION OF NANOSTRUCTURES COMPRISING COMPOSITIONALLY MODULATED FERROMAGNETIC LAYERS BY PULSED ECD" Ser. No. 11/620,480. However, applications of the present invention are not limited to ferromagnetic structures, but extend broadly to cover any device structure that requires vertical conductive structures.

Figure 3:
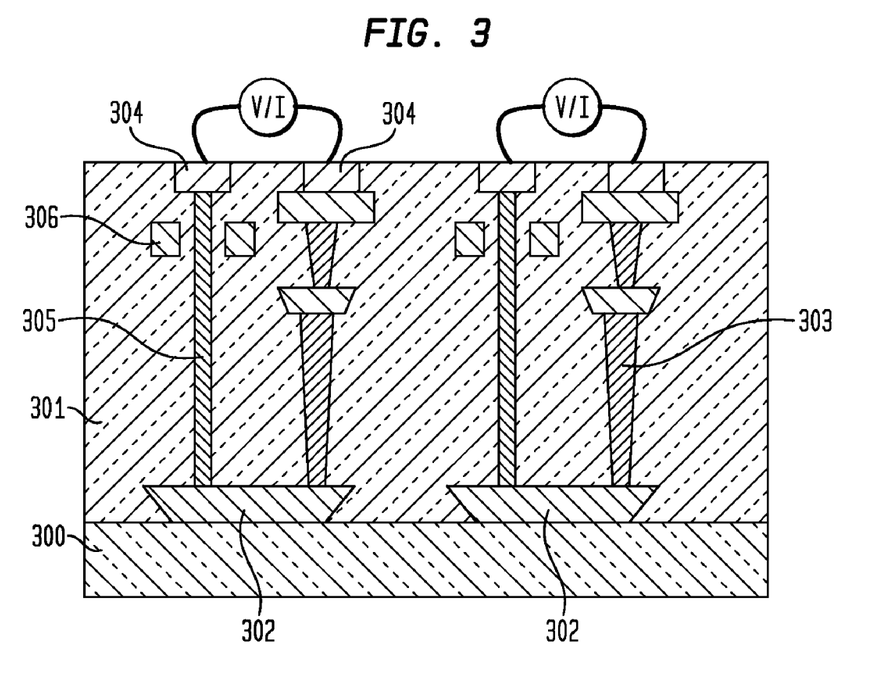
FIG. 3 is a cross-sectional view of two electronic devices, each comprising a functional unit, two auxiliary units, a metal contact pad at each end of the functional unit, and a metal via structure extending through the ILD layer to the metal contact pad that is located over a non-conductive substrate, according to one embodiment of the present invention. The metal via structures together with the metal contact pads provide access to the functional units.

FIG. 3 shows a cross-sectional view of a device structure containing two general electronic devices with vertical conductive structures 305. Each of the electronic devices may include: (1) a vertical functional unit, i.e., the vertical conductive structure 305, (2) conductive contacts 302 and 304 at both ends of the functional unit 305, (3) a metal via 303 that extends onto the bottom conductive contact 302 to provide access to the bottom conductive contact 302, and (4) certain auxiliary elements and associated circuits 306. The auxiliary elements and circuits 306 can be either reading and writing elements or other sensing and controlling elements for the functional unit 305.

The device structure as described hereinabove is formed over a non-conductive substrate 300 with an ILD layer 301 located thereover. The non-conductive substrate 300 may comprise any suitable non-conductive material, and it preferably comprises a ceramic, dielectric, glass or polymer material, including, but not limited to: $Al_2O_3$, $SiO_2$, $Si_3N_4$, and $HfO_2$. Further, the non-conductive substrate 300 may comprise an un-doped or lowly doped semiconductor material, including, but not limited to: Si, SiC, SiGe, SiGeC, Ge alloys, GaAs, InAs, InP, as well as other III-V or II-VI compound semiconductors. The ILD layer 301 may be formed of any suitable photoresist or dielectric material, such as, for example, $SiO_2$, $Si_3N_4$, $HfO_2$, and $Al_2O_3$.

The device structure of FIG. 3 can be formed by exemplary processing steps as illustrated by FIGS. 4-10, according to one embodiment of the present invention.

Figure 4:
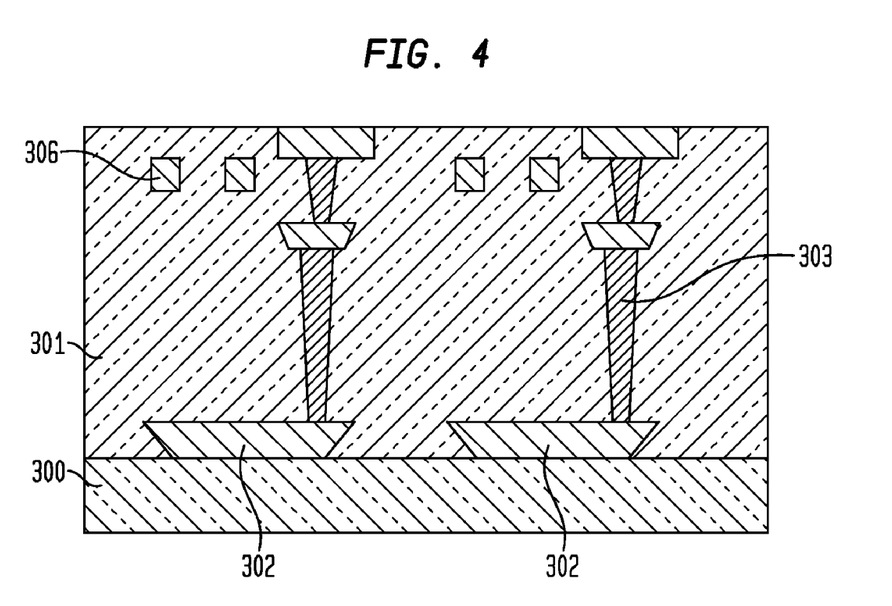
FIGS. 4-10 are cross-sectional views that illustrate exemplary processing steps for forming the device structure of FIG. 3, according to one embodiment of the present invention.

FIG. 4 shows a template structure that comprises the non-conductive substrate 300, the ILD layer 301, the bottom metal contacts 302, the metal vias 303, and the auxiliary elements 306 (optional). Such a template structure can be readily formed by conventional semiconductor processing and metallization techniques, which are not described here in order to avoid obscuring the present invention.

Figure 5:
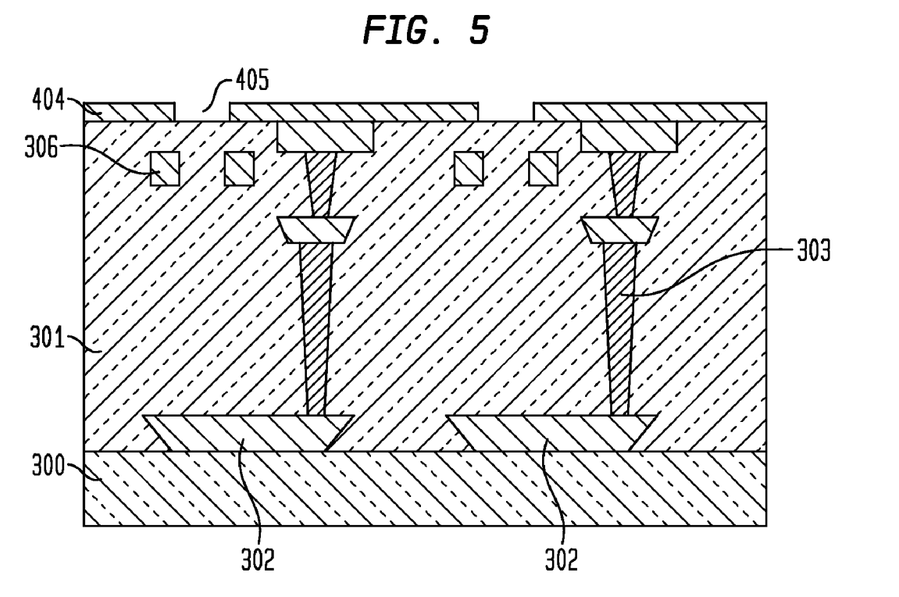

Next, as shown in FIG. 5, a patterned metal layer 404 is deposited over a top surface of the ILD layer 301. The patterned metal layer 404 forms an electrical contact with all the metal vias 303, and through such metal vias 303, the patterned metal layer 404 forms electrical contact with all the bottom metal contacts 302. The patterned metal layer 404 can be readily formed by first depositing a blanket metal layer (not shown) over the entire top surface of the ILD layer 301, followed by patterning the blanket metal layer (not shown) to form multiple openings 405. Each of the openings 405 in the patterned metal layer 404 is vertically aligned with one of the bottom metal contacts 302, thereby defining the locations where the vertical conductive structures 305 are to be formed. Patterning of the blanket metal layer (not shown) can be readily carried out using any conventional metal patterning techniques, such as lithography, etch back, lift-off, etc.

Figure 6:
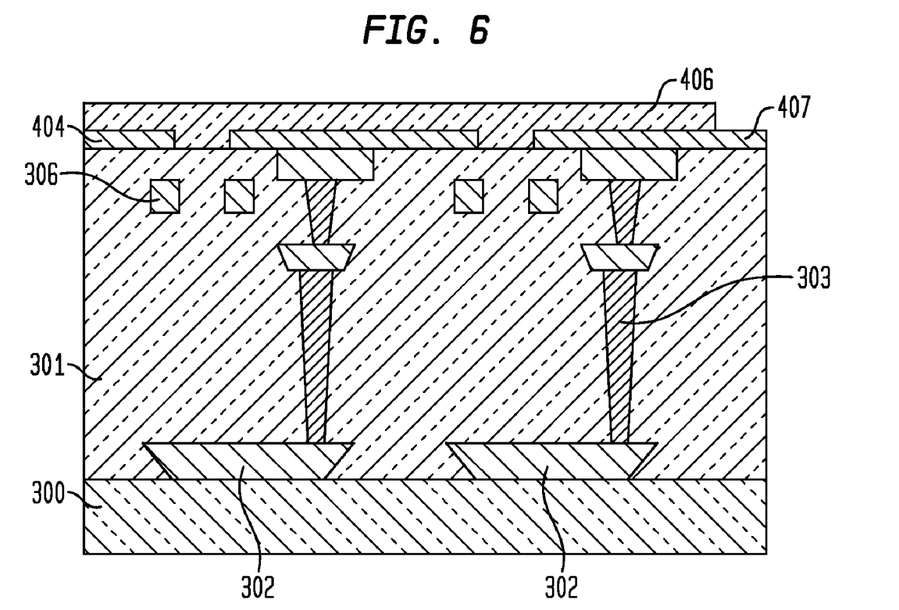

As shown in FIG. 6, a layer of insulating material 406 is then deposited over the patterned metal layer 404 to cover the entire layer 404 except at the edge region 407. The insulating material layer 406 can be formed of the same insulating material as the ILD layer 301, but generally it is formed of a different insulating material. In the semiconductor manufacturing process, numerous devices are fabricated simultaneously on the same wafer. Therefore, the edge region 407 denotes the edge region of the wafer. In this manner, the patterned metal layer 404 can still be accessed at the edge region 407 after formation of the insulating material layer 406, which the patterned metal layer 404 in turn provides access to the bottom metal contacts 302 through the metal vias 303.

Figure 7:
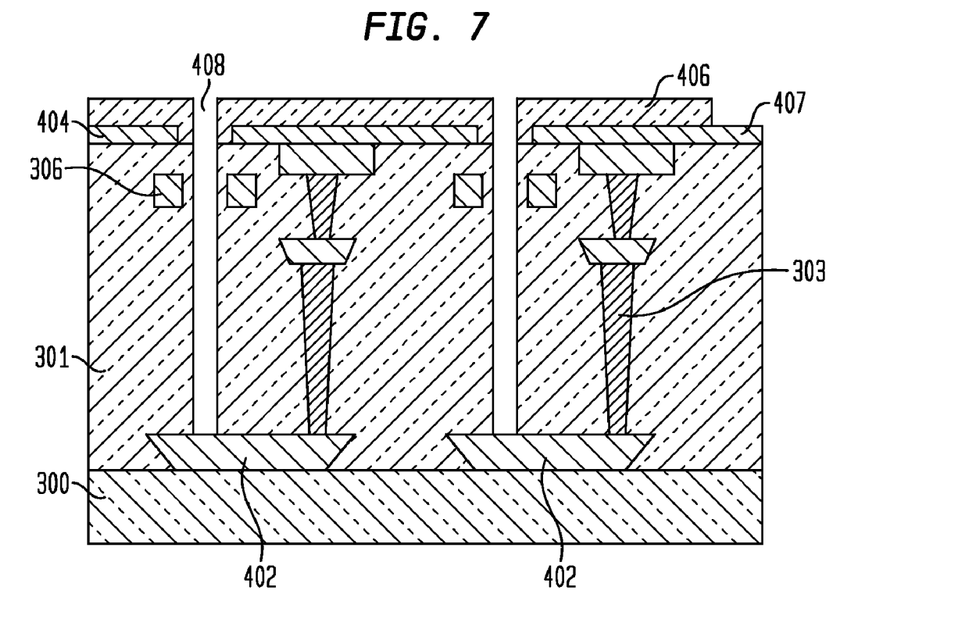

Subsequently, as shown in FIG. 7, a patterning process (preferably an etching process, such as reactive ion etching) is carried out to form vertical vias (or deep vias) 408 through the insulating layer 406 and the ILD layer 301. The dimension and shape of the vertical vias 408 define the dimension and shape of the vertical conductive structures 305 to be formed. The vertical vias 408 can be of any size or shape, depending on the requirements for the final devices and the limitations of the fabrication process. Preferably, each of the vertical vias 408 so formed has a depth ranging from about 1 micron to about 1000 microns and a cross-sectional diameter ranging from about 10 nm to about 1000 nm. The vertical vias 408 can have any suitable cross-sectional shape, including, but not limited to: circular, square, rectangular, triangular, polygonal, semi-circular, elliptical, ring-shaped, etc. Depending on whether the insulating layer 406 and the ILD layer 301 comprise the same or different insulating material(s), the etching process may comprise either a single etching step or multiple etching steps.

After the etching, electroplating is carried out by first immersing the above-described structure in an electroplating solution and then applying an electroplating current to the patterned metal layer 404 by contacting the edge region 407. In this manner, the electroplating current is carried through the patterned metal layer 404 and the metal vias 303 to the discrete metal contact pads 302 at the bottom surface of the ILD layer 301, so that a conductive material 305 is deposited onto the discrete metal contact pads 302 and gradually fills the vertical vias 408 in a bottom-up manner. The electroplating solution as described hereinabove may comprise a single salt for deposition of a single elemental, or salts of different elements for deposition of an alloy. The resulted structure 305 can comprise any suitable conductive materials, such as metals, doped semiconductors, conductive polymers, and alloys thereof, but it preferentially comprises a metal or metal alloy.

Electrodeposition of metals, doped semiconductors, and conductive polymers is well known in the art and is therefore not described in detail herein.

Preferably, but not necessarily, the electroplating solution comprises salts of two or more different ferromagnetic metals for deposition of a ferromagnetic metal alloy. More preferably, the electroplating can be carried out by applying a pulsed electroplating current with high and low potential pulses for deposition of alternating ferromagnetic layers of different material compositions, as described in the co-pending U.S. patent application entitled "FORMATION OF NANOSTRUCTURES COMPRISING COMPOSITIONALLY MODULATED FERROMAGNETIC LAYERS BY PULSED ECD" Ser. No. 11/620,480.

Figure 8:
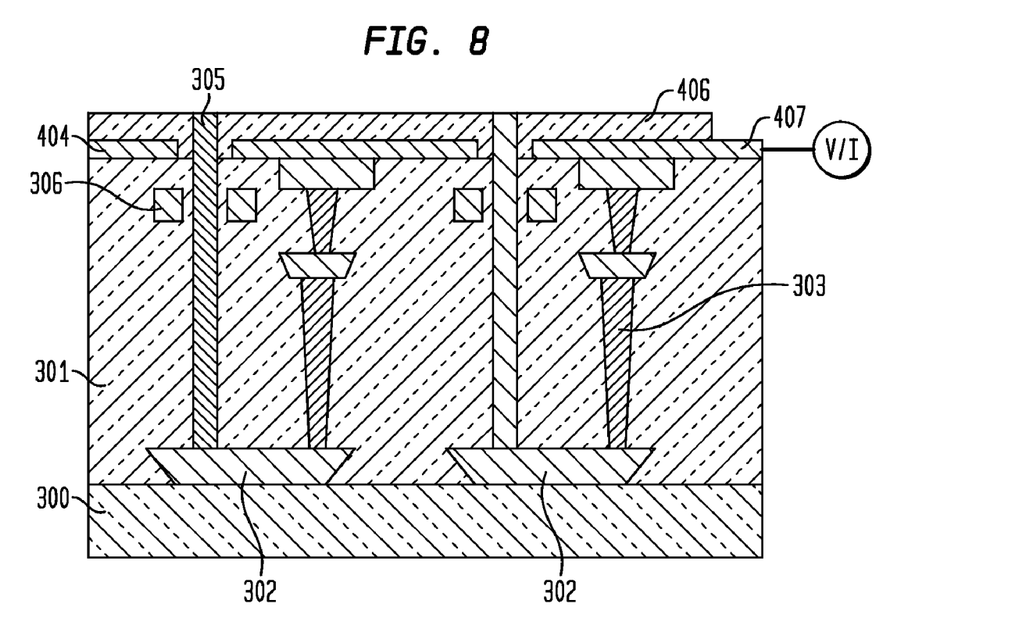

The electroplating step is allowed to proceed until the vertical vias 408 are completely filled with the metal to form vertical conductive structures 305, as shown in FIG. 8. The dimension and shape of the vertical conductive structures 305 are defined by the vertical vias 408. Therefore, the vertical conductive structures 305 may also have a depth ranging from about 1 micron to about 1000 microns and a cross-sectional diameter ranging from about 10 nm to about 1000 nm, and they may also have any suitable cross-sectional shape, including, but not limited to: circular, square, rectangular, triangular, polygonal, semi-circular, elliptical, ring-shaped, etc.

Figure 9:
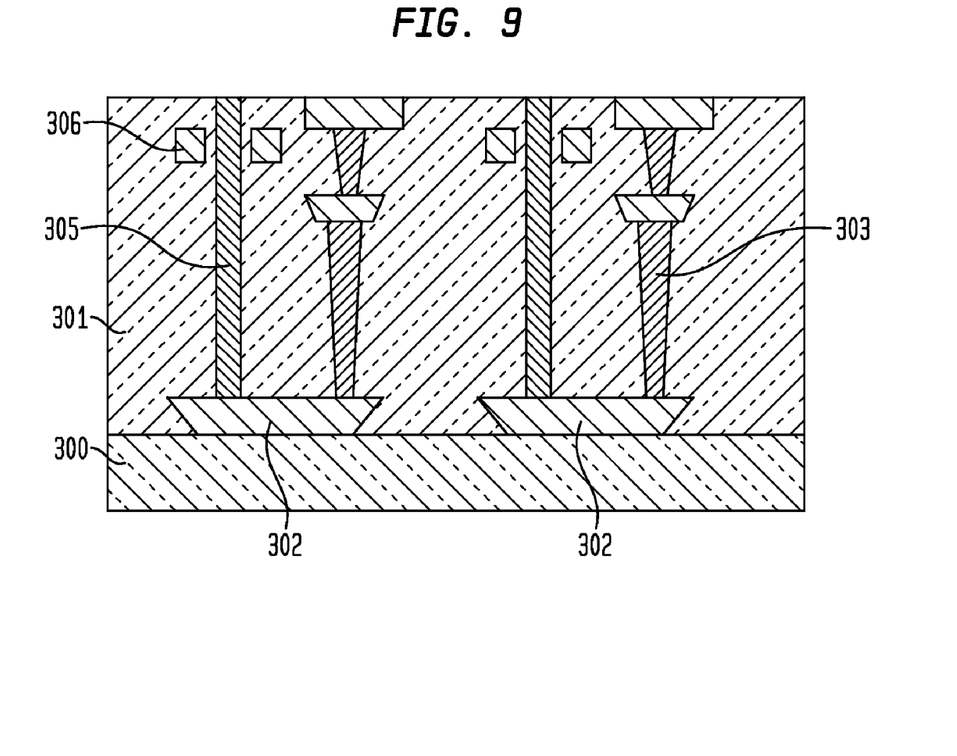

After the electroplating, multiple etching and/or polishing steps can be carried out to remove the overgrown portions of the vertical conductive structures 305, the insulating layer 406, and the patterned metal layer 404, and to planarize the again-exposed upper surface of the ILD layer 301 with the metal via 303 and the newly formed vertical conductive structure 305, as shown in FIG. 9.

Figure 10:
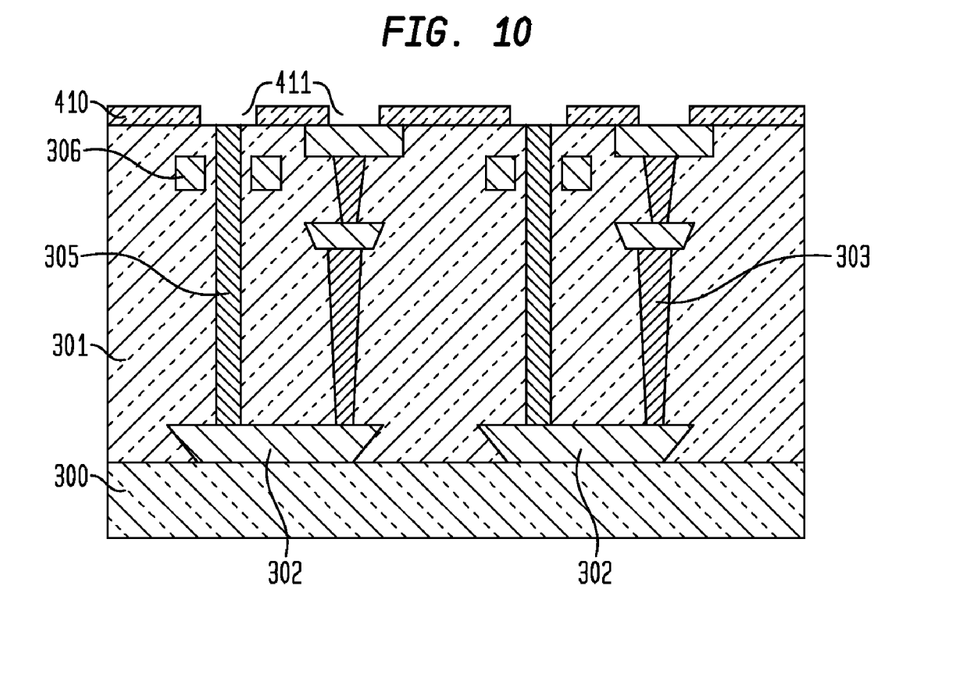

Next, a patterned insulating layer 410 is deposited over the exposed upper surface of the ILD layer 301, as shown in FIG. 10. The patterned insulating layer 410 may comprise either the same or different material from that of the ILD layer 301, and it contains multiple openings 411, through which the vertical conductive structures 305 and the metal vias 303 are exposed. In this manner, surface metal contacts 304 can be formed in the openings 411 to provide access to the vertical conductive structures 305 and the metal vias 303, thereby forming a complete device structure as shown in FIG. 3.

Note that while FIGS. 3-10 illustratively demonstrate exemplary device structures and processing steps according to specific embodiments of the present invention, it is clear that a person ordinarily skilled in the art can readily modify such device structures and processing steps for adaptation to specific application requirements, consistent with the above descriptions. For example, although the exemplary device structures as shown in FIGS. 3-10 each contain a single ILD layer, two discrete metal contact pads and two vertical conductive structures, it is readily understood that the device structure of the present invention may comprise any numbers of ILD layers, discrete metal contact pads, and vertical conductive structures. Further, the device substrates of the present invention can be readily used for forming any semiconductor devices that require vertical conductive structures with at least one bottom metal contacts.

While the invention has been described herein with reference to specific embodiments, features and aspects, it will be recognized that the invention is not thus limited, but rather extends in utility to other modifications, variations, applications, and embodiments, and accordingly all such other modifications, variations, applications, and embodiments are to be regarded as being within the spirit and scope of the invention.

What is claimed is:

1. A method comprising:
   forming a template structure comprising a substrate, a discrete metal contact pad located over a top surface of said substrate, an inter-level dielectric (ILD) layer covering both the substrate and the metal contact pad, a metal via structure extending from a top surface of said ILD layer and through the ILD layer and onto the discrete metal contact pad, and a patterned metal layer that is located on an upper surface of the ILD layer and is electrically connected to the metal via structure;
   forming a vertical via in the template structure, after forming said metal via structure, wherein said vertical via extends at least from the top surface of said ILD layer and through said ILD layer and onto the discrete metal contact pad, wherein a surface of said discrete metal contact pad is exposed at a bottom of said vertical via;
   forming a vertical conductive structure in said vertical via by electroplating, wherein the electroplating is conducted by applying an electroplating current to the discrete metal contact pad through the metal via structure; and
   forming an insulating layer over the patterned metal layer before formation of the vertical via, wherein the patterned metal layer is completely covered by the insulating layer except at an edge region, and wherein during the electroplating, the electroplating current is applied through said edge region to the patterned metal layer, and wherein the subsequently formed vertical via extends through both the insulating layer and The ILD layer.

2. The method of claim 1, wherein the vertical conductive structure comprises one or more ferromagnetic metals.

3. The method of claim 1, wherein the template structure comprises multiple discrete metal contact pads, each of which has a metal via structure extending thereto, and wherein multiple vertical vias are formed in the ILD layer for subsequent formation of multiple vertical conductive structures by electroplating.

4. The method of claim 1, further comprising removing both the patterned metal layer and the insulating layer from the upper surface of the ILD layer after the electroplating and removal of overgrown plated material.

5. The method of claim 2, wherein the vertical conductive structure comprises alternating layers of different ferromagnetic metals.

6. The method of claim 3, wherein the template structure further comprises a patterned metal layer that is located on an upper surface of the ILD layer and is electrically connected to all of the metal via structures, so that The electroplating current can be applied to the multiple discrete metal contact pads through the patterned metal layer and the metal via structures during the electroplating.

7. The method of claim 6, wherein before formation of the multiple vertical vias, the patterned metal layer is formed by:
   depositing a blanket metal layer over the upper surface of the ILD layer; and
   patterning said blanket metal layer to form multiple openings therein, each of which is vertically aligned with one of the multiple discrete metal contact pads.

8. The method of claim 4, further comprising forming multiple surface metal contacts over the upper surface of the ILD layer after removal of the patterned metal layer and the insulating layer to provide access to the vertical conductive structure.

9. A method comprising:
forming a template structure comprising a substrate, a discrete metal contact pad located over a top surface of said substrate, an inter-level dielectric (ILD) layer covering both the substrate and the metal contact pad, and a metal via structure extending through the ILD layer onto the discrete metal contact pad;
forming a vertical via in the template structure, wherein said vertical via extends through said ILD layer onto the discrete metal contact pad;
forming a vertical conductive structure in said vertical via by electroplating, wherein the electroplating is conducted by applying an electroplating current to the discrete metal contact pad through the metal via structure, wherein the template structure comprises multiple discrete metal contact pads, each of which has a metal via structure extending thereto, and wherein multiple vertical vias are formed in the ILD layer for subsequent formation of multiple vertical conductive structures by electroplating, wherein the template structure further comprises a patterned metal layer that is located on an upper surface of the ILD layer and is electrically connected to all of the metal via structures, so tat the electroplating current can be applied to the multiple discrete metal contact pads through the patterned metal layer and the metal via structures during the electroplating, and wherein before formation of the multiple vertical vias, the patterned metal layer is formed by depositing a blanket metal layer over the upper surface of the ILD layer and patterning said blanket metal layer to form multiple openings therein, each of which is vertically aligned with one of the multiple discrete metal contact pads; and
forming an insulating layer over the patterned metal layer before formation of the vertical vias, wherein the patterned metal layer is completely covered by the insulating layer except at an edge region, and wherein during the electroplating, the electroplating current is applied through said edge region to the patterned metal layer, and wherein the subsequently formed vertical via extends through both the insulating layer and the ILD layer.

10. The method of claim 9, further comprising removing both the patterned metal layer and the insulating layer from the upper surface of the ILD layer after the electroplating and removal of overgrown plated material.

11. The method of claim 10, further comprising forming multiple surface metal contacts over the upper surface of the ILD layer after removal of the patterned metal layer and the insulating layer to provide access to the vertical conductive structures.

12. A method comprising:
forming a template structure comprising a substrate, a discrete metal contact pad located over a top surface of said substrate, an inter-level dielectric (ILD) layer covering both the substrate and the metal contact pad, a metal via structure extending from a top surface of the ILD layer through the ILD layer and onto the discrete metal contact pad and directly contacting a top surface of the discrete metal contact pad, and a patterned metal layer that is located on an upper surface of the ILD layer and is electrically connected to the metal via structure;
forming a vertical via in the template structure, after forming said metal via structure, wherein said vertical via extends at least from the top surface of the ILD layer and though said ILD layer and onto the discrete metal contact pad;
forming a vertical conductive structure in said vertical via by electroplating, wherein the electroplating is conducted by applying an electroplating current to the discrete metal contact pad though the metal via structure;
forming an insulating layer over the patterned metal layer before formation of the vertical via; and
removing both the patterned metal layer and the insulating layer from the upper surface of the ILD layer after the electroplating and removal of overgrown plated material.

13. The method of claim 12, wherein a surface of said discrete metal contact pad is exposed at a bottom of said vertical via after forming said vertical via.

14. The method of claim 12, wherein the patterned metal layer is completely covered by the insulating layer except at an edge region, and wherein during the electroplating, the electroplating current is applied through said edge region to the patterned metal layer.

15. The method of claim 12, wherein the subsequently formed vertical via extends through both the insulating layer and the ILD layer.

16. The method of claim 12, further comprising forming multiple surface metal contacts over the upper surface of the ILD layer after removal of the patterned metal layer and the insulating layer to provide access to the vertical conductive structure.

* * * * *